SEMICONDUCTOR INTEGRATED CIRCUITS AND METHOD OF MAKING SAME

Filed March 26, 1965

INVENTOR.
Thomas N. Tucker
BY Howard W. Hermann
ATTORNEY

United States Patent Office 3,397,448
Patented Aug. 20, 1968

3,397,448
SEMICONDUCTOR INTEGRATED CIRCUITS AND METHOD OF MAKING SAME

Thomas N. Tucker, Freeland, Mich., assignor to Dow Corning Corporation, Midland, Mich., a corporation of Michigan Filed Mar. 26, 1965, Ser. No. 443,046
4 Claims. (Cl. 29—577)

ABSTRACT OF THE DISCLOSURE

Method of making semiconductor integrated circuits by forming monocrystalline silicon islands in a substrate of high density homogeneous silicon carbide is disclosed. The hardness of silicon carbide enables the circuits to be compactly and economically made and easily lapped or etched, while its good thermal conductivity and electrical insulation properties enable the circuit to rapidly dissipate the heat generated by the active elements of the circuit when they are in use and provide electrical isolation between adjacent silicon islands.

The present invention relates to semiconductor electronic circuits and more particularly, to methods and techniques for making integrad semiconductor electronic integrated circuits.

In an article by Maxwell et al. entitled, "The Minimization of Parasitics in Integrated Circuits by Dielectric Isolation," appearing in the January 1965, issue of IEEE Transactions of Electron Devices, at pages 20–24, there is described a new technique for fabrication of integrated electronic circuits. In accordance with this technique, islands of semiconductor material are formed in a dielectric substrate which also serves as electrical isolation means between islands. The islands are then formed into active devices such as transistors, and interconnection means and passive devices are formed by conventional means to provide a completed integrated circuit.

The process for providing the islands is described by the aforementioned article. In the approaches described, an oxide layer (dielectric) is grown on top of a monocrystalline silicon wafer, and holes are cut or etched in the oxide. The silicon wafer is then etched through the holes in the oxide wafer, or alternatively, epitaxial silicon is grown in the holes to provide, in effect, islands of silicon separated by moats. A second oxide layer is then grown over the entire surface and polycrystalline silicon of substantial thickness is deposited over the second oxide layer to serve as a mechanical support. The original wafer is then lapped or etched down to the level of the oxide so that islands are all that remain of the initial wafer. These islands are, of course, isolated by the oxide and supported by the polycrystalline silicon.

The article states that ideally the separate components would be embedded in a dielectric and would have a planar upper surface so that thin film interconnections could be applied. The article states, however, that although this approach is desirable, it is not practical when heat dissipation is considered since a good electrical insulator is not usually a good heat conductor.

The method outlined in the article is workable, but has several disadvantages. There are at least three deposition steps required to deposit the necessary oxide and mechanical support layers. These steps are time consuming. It is also difficult to control the lapping or etching operation when the excess wafer material is being removed, since the oxide is also easily removed by etching or lapping. The silicon must necessarily be completely removed over the oxide between islands if effective isolation is to be achieved. On the other hand, since the oxide layer is quite thin and easily removed in the etching or lapping process, it is often removed by mistake resulting in excess lapping or etching of the islands and ineffective isolation between islands.

An object of the present invention is to provide an improved method of achieving electrical isolation between semiconductor islands in integrated circuits, which eliminates the aforesaid disadvantages of prior art techniques.

A further object is to provide a method of forming integrated circuit components which is more economical than prior art techniques.

Another object is the provision of a practical method of forming integrated circuit components embedded in an insulating medium having good heat conducting properties and sufficient mechanical strength to avoid the necessity of adding mechanical reinforcement.

In accordance with these and other objects there is provided by the present invention a method of making semiconductor integrated circuits wherein silicon islands are formed in a substrate of high density homogeneous silicon carbide. Silicon carbide is a very hard material which is more chemically inert than silicon, has good heat conducting properties and can be made with good electrical insulating properties. The initial steps of the process of the present invention are substantially the same as the steps described in the aforementioned article. With the use of silicon carbide in place of the oxide layer, further deposition steps and oxide forming steps become unnecessary. Lapping is easily controlled since silicon carbide is very hard. As a consequence, the thickness of the islands is also easily controllable. The silicon carbide layer has sufficient strength so that the need for additional mechanical support is obviated. The resulting thinness of the structure saves space with is important in some applications.

Other objects and attendant advantages of the present invention will become obvious to those skilled in the art by a consideration of the following detailed description when read in conjunction with the accompanying drawings wherein.

Figures 1, 2, 3, 4, 5, 6:
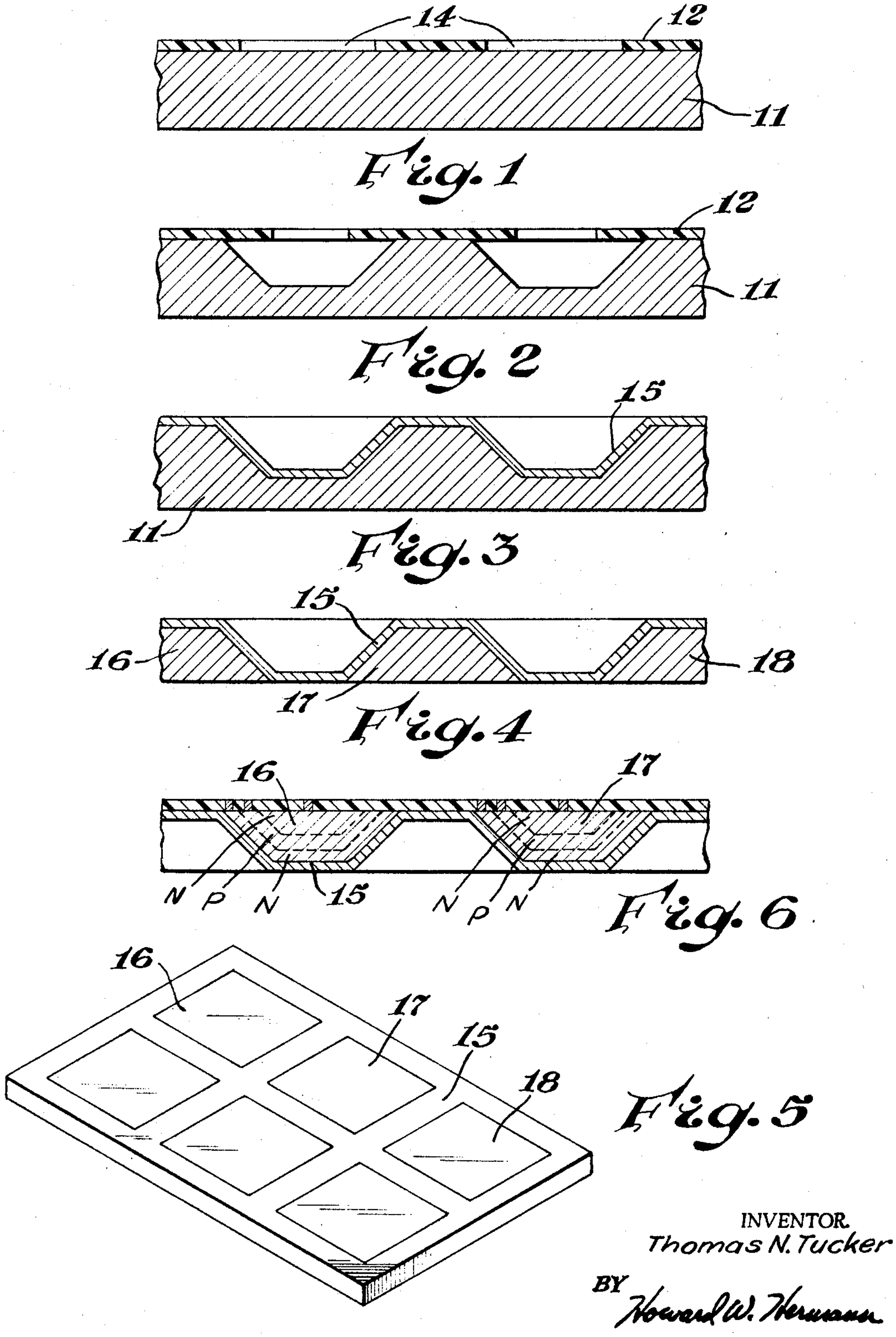
FIG. 1 is a fragmentary cross-sectional view of a silicon slice masked in accordance with the present invention.
FIG. 2 is a cross-sectional view of the slice of FIG. 1 after etching to form silicon islands.
FIG. 3 is a cross-sectional view of the slice of FIGS. 1 and 2, after deposition of the silicon carbide dielectric.
FIG. 4 is a cross-sectional view of the composite device of FIG. 3 after the lapping operation.
FIG. 5 is a view in perspective of a completed set of semiconductor islands embedded in an insulating substrate in accordance with the present invention.
FIG. 6 is a cross-sectional view of a pair of completed active devices ready for deposition of passive devices and interconnections to complete an integrated circuit in accordance with the present invention.

Referring now to the drawings, wherein like reference numerals designate like or corresponding parts throughout the several views, there is shown in FIG. 1 a portion of a wafer 11 of monocrystalline silicon over which has been placed a mask 12 which may be, for example, a photo-resist material.

The mask is utilized for selective etching of the semiconductor crystal in a manner conventional in the art with one exception. While allowance must generally be made for etching under the mask a distance equal to the depth of the etch, in this case the exposed area of the semiconductor island which will subsequently form the desired active device will be exactly the size of the mask area. Therefore, no allowance for lateral etching is needed. As shown in FIG. 2 the etching proceeds both laterally and vertically at the same rate so that the walls of the etched out portions form 45° angles with respect to the mask. The bottom of the etched out portion, however, retains the same dimensions as the hole 14 in the mask.

If desired, epitaxial silicon may be deposited in the mask openings instead of etching. This is best accomplished by providing an oxide coating over the silicon surface before application of the mask. The oxide is etched in the masked openings to expose the silicon surface. The mask is then removed and the oxide used as a mask for epitaxial silicon deposition. The purpose of the etching or deposition is merely to form raised portions corresponding in thickness to the desired thickness of the active devices being made.

The forming step is continued until a depth equal to the desired thickness of the active devices to be formed is reached. The mask is then removed and homogeneous silicon carbide is deposited over the surface of the crystal wafer as shown by the layer 15 in FIG. 3. Several methods are known for depositing silicon carbide on a silicon substrate. Preferably, this is done in accordance with the present invention by decomposition of an alkylsilane in a hydrogen gas carrier. Suitable substances which may be used to deposit homogeneous silicon carbide by this method include trimethylmonochlorosilane, methyltrichlorosilane, propyltrichlorosilane, dimethyldichlorosilane, among other compounds, and various halogenated and nonhalogenated silane and alkylsilane mixtures. Doping of the silicon carbide with impurities to obtain any desired resistivities in cases where doping is desirable, may be accomplished by adding doping impurities to the gas mixture during deposition.

The decomposition is carried out by passing the gas over the silicon substrate while the substrate is heated to a temperature above about 1050° C., but below the melting point of silicon which is about 1425° C. A mixture of hydrogen and dimethyldichlorosilane, for example, in a ratio of 1 to 1 may be flowed over the silicon surface. The deposition is continued until the silicon carbide reaches a desired thickness. A layer from 2 to 4 mils or greater, in thickness has been found to be satisfactory. The thickness is not critical except to the extent that sufficient strength for easy handling without danger of breakage be obtained.

After the deposition is completed as shown in FIG. 3, the silicon wafer 11 is etched or lapped to the level of the silicon carbide layer 15 as shown in FIG. 4, leaving islands 16, 17, 18 of silicon isolated from one another by the silicon carbide. Due to the extreme hardness of the silicon carbide as compared to the hardness of silicon the lapping is easily controlled. It has been found in tests that large grits may be used without danger of breaking the bonds between the silicon islands and their surrounding insulating layer. Conventional polishing techniques may be used at the end of the lapping operation to obtain a surface finish suitable for device quality over the island surfaces. Etching may be used successfully in place of the lapping operation, and may also be easily controlled since the etchants commonly used for silicon ($HF:HNO_3$, for example), have little, if any effect on the silicon carbide.

FIG. 5 illustrates in perspective view a group of silicon islands 16, 17 and 18 embedded in the dielectric silicon carbide layer 15. By conventional techniques, active devices may be fabricated from the island as illustrated in FIG. 6 and insulating layers, connections, and passive elements may be deposited as desired to complete the desired circuit.

Obviously, many modifications and variations of the present invention will become obvious to those skilled in the art. It is to be understood, therefore, that within the scope of the appended claims the invention may be practiced, otherwise than as specifically described.

That which is claimed is:

1. A method of making a semiconductor electronic integrated circuit comprising:
- forming a wafer of monocrystalline silicon to provide raised portions separated by lower portions,
- depositing an insulating layer of homogeneous silicon carbide over the surface of the raised and lower portions,
- removing the silicon to the level of the silicon carbide layer formed on said lower portions, thereby forming a plurality of islands of silicon isolated from one another by silicon carbide, and
- forming said silicon islands into active elements and depositing passive elements and electrical interconnections to complete said circuit.

2. A method of making a semiconductor electronic integrated circuit as defined in claim 1 wherein said removing the silicon to the level of the silicon carbide includes a mechanical lapping operation.

3. A method of making a semiconductor electronic insulated circuit comprising:
- masking a wafer of monocrystalline silicon with a mask corresponding in shape to a desired configuration of spaced active silicon devices,
- etching said silicon wafer through said mask to a depth equal to the desired depth of said spaced active silicon devices,
- removing said mask,
- depositing a layer of homogeneous silicon carbide over the surface of said wafer,
- removing the silicon to the level of the silicon carbide formed over the etched portions thereby forming a plurality of islands of silicon isolated from one another by silicon carbide, and
- forming said silicon islands into active elements and depositing passive elements and electrical interconnections to complete said circuit.

4. A method of making a semiconductor electronic integrated circuit as defined in claim 3, wherein said removing the silicon to the level of the silicon carbide formed over the etched portions includes a mechanical lapping operation.

References Cited

UNITED STATES PATENTS

| | | | |
|---|---|---|---|
| 2,840,494 | 6/1958 | Parker | 317—235 |
| 2,993,814 | 7/1961 | Epprecht | 117—201 |
| 3,290,753 | 12/1966 | Chang | 29—25.3 |
| 3,300,832 | 1/1967 | Cave | 29—25.3 |
| 3,312,879 | 4/1967 | Godejahn. | |

WILLIAM I. BROOKS, *Primary Examiner.*